(12) United States Patent
Nishiyama

(10) Patent No.: US 7,276,667 B2
(45) Date of Patent: Oct. 2, 2007

(54) PRESS-FIT SEALED ELECTRONIC COMPONENT AND METHOD FOR PRODUCING THE SAME

(75) Inventor: Yoshihide Nishiyama, Chino (JP)

(73) Assignee: Seiko Epson Corporation (JP)

( * ) Notice: Subject to any disclaimer, the term of this patent is extended or adjusted under 35 U.S.C. 154(b) by 221 days.

(21) Appl. No.: 10/968,842

(22) Filed: Oct. 19, 2004

(65) Prior Publication Data

US 2005/0153196 A1 Jul. 14, 2005

(30) Foreign Application Priority Data

Nov. 14, 2003 (JP) ............................... 2003-384563

(51) Int. Cl.
*H01B 17/58* (2006.01)

(52) U.S. Cl. ...................... 174/167; 174/154; 174/157; 174/168

(58) Field of Classification Search ................ 174/167, 174/154, 50, 50.5, 50.52, 168, 157
See application file for complete search history.

(56) References Cited

U.S. PATENT DOCUMENTS

| 4,296,458 | A | * | 10/1981 | Smith et al. ................. 361/518 |
| 6,769,936 | B2 | * | 8/2004 | Gutierrez et al. ........... 439/676 |

FOREIGN PATENT DOCUMENTS

| JP | 2586981 | 12/1996 |
| JP | 09-260990 | 10/1997 |
| JP | 10-150115 | 6/1998 |
| JP | 2003-133460 | 5/2003 |
| JP | 2003-142614 | 5/2003 |

OTHER PUBLICATIONS

Communication from Japanese Patent Office re: related application.

* cited by examiner

*Primary Examiner*—Dhiru R. Patel
(74) *Attorney, Agent, or Firm*—Harness, Dickey & Pierce, P.L.C.

(57) ABSTRACT

A press-fit sealed electronic component includes an electronic component, a plug to be equipped with the electronic component, and a tube to be sealed by press-fitting the plug, wherein the plug is brought into close contact with the tube through a tin-free alloy layer. A method for producing a press-fit sealed electronic component includes the steps of forming the plug and the tube with a nickel silver material, forming a tin-copper layer by plating on each surface of the plug and the tube, forming a copper-zinc alloy layer at the interface between the nickel silver material and the tin-copper layer by heat treatment, removing the tin-copper layer remaining on the copper-zinc alloy layer to expose the copper-zinc alloy layer, and bringing the plug into close contact with the tube through the exposed copper-zinc alloy layer to seal the tube by press-fit.

5 Claims, 3 Drawing Sheets

PRESS-FIT SEALED ELECTRONIC COMPONENT AND METHOD FOR PRODUCING THE SAME

BACKGROUND OF THE INVENTION

1. Field of the Invention

The present invention relates to a press-fit sealed electronic component and a method for producing the same.

2. Description of the Related Art

Electronic components such as a quartz oscillator are hermetically sealed in a predetermined package so that the operating environment is stably kept clean. According to Japanese Unexamined Patent Application Publication No. 09-260990 (pp. 2-3, FIG. 1), the surface of a sealing tube formed by press working is planarized by a chemical treatment. This technology does not require a step of plating, and in addition, prevents the leakage caused by press-fitting a plug. Japanese Patent No. 2,586,981 (p. 2, FIG. 1) discloses a technology for producing a pressed component composed of nickel silver having excellent luster and good quality at a relatively low cost. In this technology, a metal cover of, for example, a quartz oscillator, the cover composed of nickel silver formed by press working, is annealed in a controlled atmosphere so that zinc (Zn) is thickened at the surface. Furthermore, according to a technology disclosed in Japanese Unexamined Patent Application Publication No. 10-150115 (pp. 2-3, FIG. 1), a nickel (Ni) layer formed by plating on the surface of a nickel silver sheet is recrystallized by heat treatment in order to prevent fracture of the nickel plated layer during a subsequent deep drawing process to form a sealing case.

However, in the known art described in Japanese Unexamined Patent Application Publication No. 09-260990, the periphery of the plug, which is to be press-fitted in the sealing tube is plated with copper as an underlayer, and the copper layer is then plated with solder (i.e., tin-lead alloy) in order to improve airtightness by press-fit. Since the plug is press-fitted in the sealing tube while the solder plating layer is scraped, internal stress remains in the scraped plated pieces. Therefore, whiskers (needle-like crystals) generated by the internal stress causes a problem. Even if the internal stress is relieved by annealing, the whiskers are generated due to tin (Sn) in the solder plating layer. Unfortunately, contact between the whiskers and a quartz oscillator deteriorates the characteristics of the quartz oscillator.

In addition, lead (Pb) in the solder plating layer worsens the working environment of the plating. Even when a lead-free alternative material such as an alloy of tin and copper is used for plating, whiskers are generated due to the tin. The use of the alternative material also causes the same problem. Furthermore, the inventions disclosed in Japanese Patent No. 2,586,981 and Japanese Unexamined Patent Application Publication No. 10-150115 do not contribute to the improvement of the air-sealing between the sealing tube and the plug.

SUMMARY OF THE INVENTION

In order to solve the above problems, it is an object of the present invention to provide a press-fit sealed electronic component that prevent formation of whiskers and has superior airtightness between a sealing tube and a plug, and a method for producing the same.

A press-fit sealed electronic component according to the present invention is characterized in that it includes an electronic component; a plug to be equipped with the electronic component; and a tube to be sealed by press-fitting the plug, wherein the plug is brought into close contact with the tube through a tin-free alloy layer. Since the alloy layer disposed at the contact portion between the plug and the tube is tin-free, whiskers are not generated at the contact portion, i.e., the alloy layer portion. Accordingly, since the electronic component does not come in contact with the whiskers, the characteristics of the electronic component are not deteriorated.

The plug and the tube are characteristically composed of a nickel silver material (nickel-zinc-copper alloy) and the alloy layer is preferably composed of a copper-zinc alloy. As a result, superior airtightness and water-tightness at the contact portion between the plug and the tube are provided. In addition, since the alloy layer is tin-free, whiskers are not generated at the contact portion, i.e., the alloy layer portion. Since the operating environment of the electronic component is satisfactorily kept and the electronic component does not come in contact with the whiskers, the characteristics of the electronic component are not deteriorated.

The alloy layer is characteristically formed by heat treatment at the interface between the nickel silver material and a tin-copper layer formed by plating on the surface of the nickel silver material. Since the tin-copper layer is tightly formed by plating on the surface of the nickel silver material (nickel-zinc-copper alloy), the copper-zinc alloy layer, which is formed by heat treatment at the interface between the nickel silver material and the tin-copper layer, is also tightly formed. In the present invention, the tin-copper layer disposed at the upper part of the alloy layer is removed and the tube is then sealed by press-fitting the plug. Since the copper-zinc alloy layer is tightly formed, the alloy layer does not peel. Therefore, the electronic component does not come in contact with the peeled pieces. Furthermore, the alloy layer provides superior airtightness and water-tightness at the contact portion. Since the operating environment of the electronic component is satisfactorily kept, the characteristics of the electronic component are not deteriorated.

The tin-copper layer is characteristically lead-free. Accordingly, the working environment of the plating is maintained safely. In the present invention, the tin-copper layer disposed at the upper part of the copper-zinc alloy layer is then removed so that the alloy layer formed at the interface with the plated tin-copper layer remains. In the step of removing the tin-copper layer, the working environment is maintained safely. In addition, the removed tin-copper layer is readily disposed of.

The electronic component is characteristically a quartz oscillator. The present invention provides a press-fit sealed quartz oscillator wherein the operating environment is satisfactorily kept and its characteristics are guaranteed.

Further, a method for producing a press-fit sealed electronic component including an electronic component, a plug to be equipped with the electronic component, and a tube to be sealed by press-fitting the plug according to the present invention, includes a step of forming the plug and the tube with a nickel silver material; a step of forming a tin-copper layer by plating on each surface of the plug and the tube; a step of forming a copper-zinc alloy layer at the interface between the nickel silver material and the tin-copper layer by heat treatment; a step of removing the tin-copper layer remaining on the copper-zinc alloy layer to expose the copper-zinc alloy layer; and a step of bringing the plug into close contact with the tube through the exposed copper-zinc alloy layer to seal the tube by press-fit. According to the present invention, (i) the plug and the tube are composed of a nickel silver material (nickel-zinc-copper alloy) having excellent formability; (ii) the tin-copper layer is tightly formed by plating on the nickel silver material; (iii) the copper-zinc alloy layer is tightly formed by heat treatment at the interface between the tin-copper layer and the nickel silver material; (iv) the tin-copper layer disposed at the upper part of the alloy layer is removed; and (v) the tube is then sealed by press-fitting the plug. Therefore, the alloy layer is tin-free and does not peel. The electronic component does not come in contact with whiskers and the peeled pieces, and the alloy layer provides superior air-sealing and liquid-sealing at the contact portion. Since the operating environment of the electronic component is satisfactorily kept, the characteristics of the electronic component are not deteriorated.

The tin-copper layer is characteristically lead-free. Accordingly, the working environment of the plating is maintained safely. In the present invention, the tin-copper layer disposed at the upper part of the copper-zinc alloy layer is then removed so that the alloy layer formed at the interface with the plated tin-copper layer remains. In the step of removing the tin-copper layer, the working environment is maintained safely. In addition, the removed tin-copper layer is readily disposed of.

The electronic component is characteristically a quartz oscillator. The present invention provides a method for stably producing a press-fit sealed quartz oscillator at a low cost, wherein the operating environment is satisfactorily kept and its characteristics are guaranteed.

DESCRIPTION OF THE PREFERRED EMBODIMENTS

A press-fit sealed electric component and a method for producing the press-fit sealed electric component will now be described in a first embodiment and a second embodiment, respectively, using a press-fit sealed quartz oscillator as an example of the press-fit sealed electric component. The electric component is not limited to a quartz oscillator and includes a crystal resonator, other electronic elements, magnetic elements, and batteries.

First Embodiment

Figure 1A:
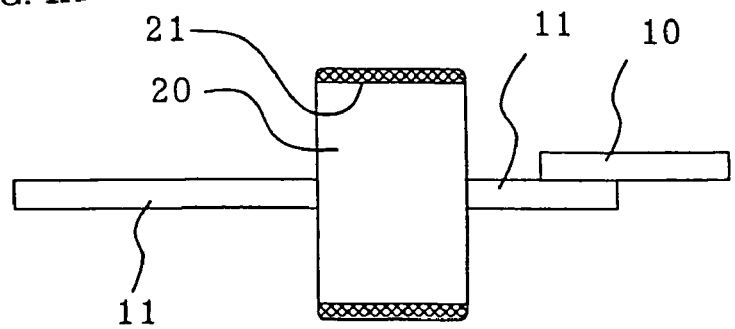
FIGS. 1A, 1B, and 1C are schematic cross-sectional views of a press-fit sealed quartz oscillator according to a first embodiment of the present invention.
Figure 1B:
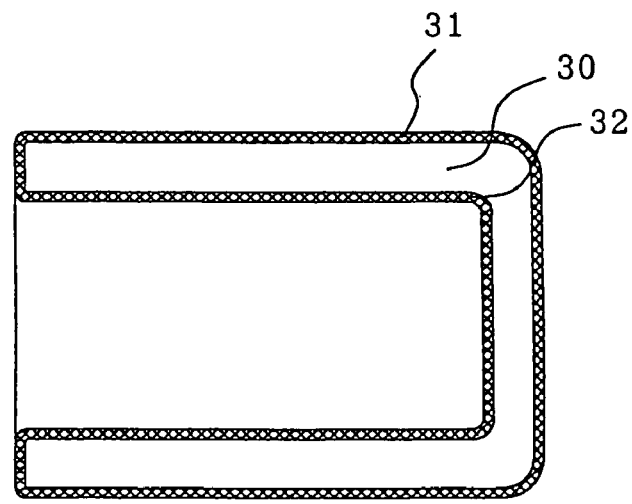
Figure 1C:
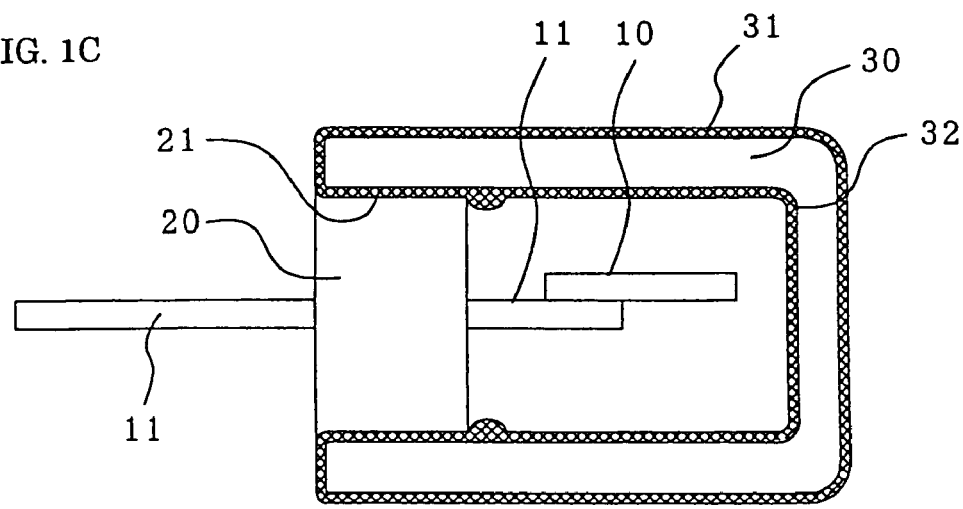

FIGS. 1A, 1B, and 1C are cross-sectional schematic views of a press-fit sealed quartz oscillator according to a first embodiment of the present invention. Referring to FIG. 1A, a quartz oscillator 10 is disposed on a lead 11. The lead 11 penetrates a plug 20 air and water-tightly, and is fixed in the plug 20. The plug 20 is composed of a nickel silver (nickel-zinc-copper alloy). A peripheral alloy layer 21 composed of a copper-zinc alloy is disposed at the periphery of the plug 20. Referring to FIG. 1B, a tube 30 is composed of a nickel silver and has a cup-like shape (a cylinder with a bottom). An exterior alloy layer 31 and an interior alloy layer 32 are disposed at the outer surface and the inner surface of the tube, respectively. The exterior alloy layer 31 and the interior alloy layer 32 are composed of a copper-zinc alloy.

Referring to FIG. 1C, since the plug 20 is press-fitted in the tube 30; the periphery of the plug 20 is brought into close contact with the inner surface of the tube 30 through the peripheral alloy layer 21 and the interior alloy layer 32 so as to be airtight and water-tight. Thus, the tube 30 is hermetically sealed (this sealed state is referred to as "press-fit sealed" in the present invention). In addition, the peripheral alloy layer 21 and the interior alloy layer 32 do not generate whiskers because the peripheral alloy layer 21 and the interior alloy layer 32 are composed of the copper-zinc alloy that does not contain tin (Sn). Since the operating environment of the quartz oscillator 10 is satisfactorily kept and the quartz oscillator 10 does not come in contact with the whiskers, the characteristics of the quartz oscillator 10 are not deteriorated.

Second Embodiment

Figure 2A:
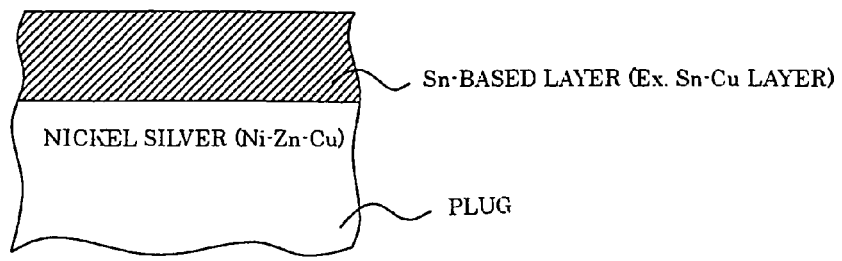
FIGS. 2A, 2B, and 2C are cross-sectional views for sequentially explaining a method for producing a press-fit sealed quartz oscillator according to a second embodiment of the present invention.
Figure 2B:
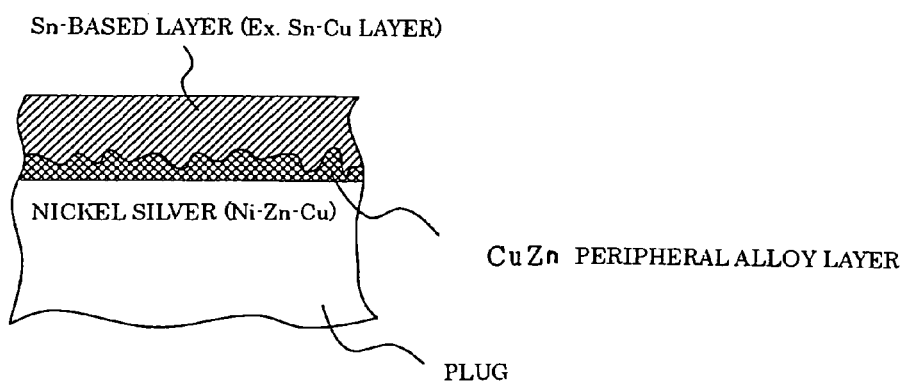
Figure 2C:
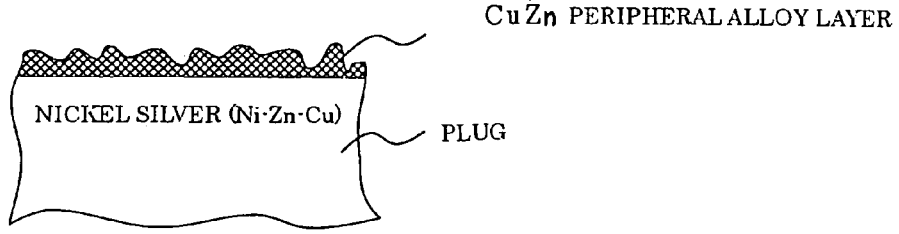

FIGS. 2A, 2B, and 2C are schematic cross-sectional views sequentially showing the periphery of a plug in a method for producing a press-fit sealed quartz oscillator according to a second embodiment of the present invention. In FIGS. 2A to 2C, the same components as those in FIGS. 1A to 1C have the same reference numerals and the description is partly omitted. Since the outer surface and the inner surface of the tube 30 are produced as the periphery of the plug 20, the method for producing the surfaces of the tube 30 is not described.

In the step shown in FIG. 2A, a tin-based layer 40 (for example, tin-copper layer (Sn-3% Cu)) is formed by plating at the periphery of a plug 20 composed of a nickel silver (nickel-zinc-copper alloy).

In the step shown in FIG. 2B, the plug 20 is heat-treated. As a result, a peripheral alloy layer 21 composed of a copper-zinc alloy is formed at the interface between the periphery of the plug 20 and the tin-based layer 40. In the heat treatment, the plug 20 is heated, for example, at about 230° C. to about 300° C. in nitrogen ($N_2$) gas at the atmospheric pressure.

In the step shown in FIG. 2C, the tin-based layer 40 on the peripheral alloy layer 21 composed of the copper-zinc alloy, is removed by etching. As a result, the peripheral alloy layer 21 having the irregular surface is exposed at the periphery of the plug 20. For example, the tin-based layer 40 is etched by dipping in a mixture of ethanol (95%) and hydrochloric acid (5%) or a mixture of ethanol (95%) and nitric acid (5%).

In the above processes, the peripheral alloy layer 21 is exposed at the periphery of the plug 20, and the interior alloy layer 32 is exposed at the inner surface of the tube 30. Therefore, when the plug 20 is press-fitted in the tube 30, the peripheral alloy layer 21 of the plug 20 is brought into close contact with the interior alloy layer 32 of the tube 30 so as to be airtight and water-tight. Thus, the tube 30 is hermetically sealed. In addition, the peripheral alloy layer 21 and the interior alloy layer 32 do not generate whiskers because the peripheral alloy layer 21 and the interior alloy layer 32 are composed of the copper-zinc alloy that does not contain tin (Sn). Since the operating environment of the quartz oscillator 10 is satisfactorily kept and the quartz oscillator 10 does not come in contact with the whiskers, the characteristics of the quartz oscillator 10 are not deteriorated (see, FIG. 1C).

Figure 3:
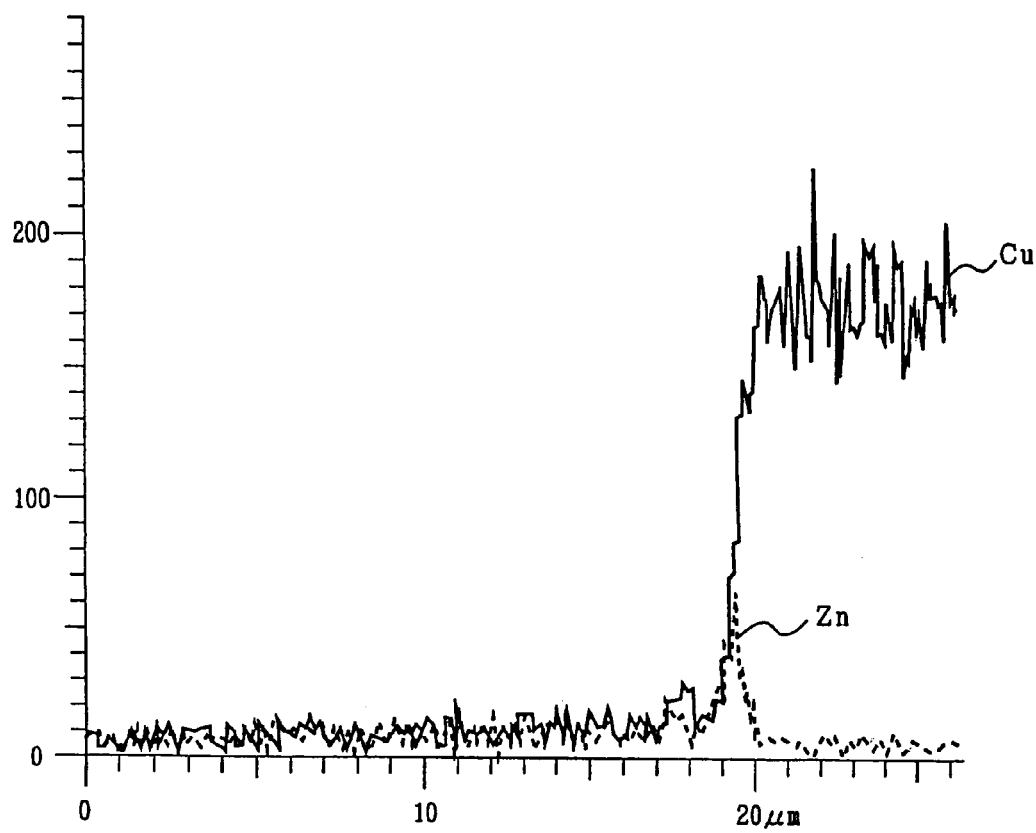
FIG. 3 is an X-ray microanalysis (XMA) chart showing the presence of copper (Cu) and zinc (Zn) at the interface with a plated layer in the method for producing a press-fit sealed quartz oscillator according to the second embodiment of the present invention.

FIG. 3 is an XMA chart showing the presence of copper (Cu) and zinc (Zn), as an experimental result which proves formation of an alloy layer composed of copper-zinc alloy at the interface of the plating, in the method for producing a press-fit sealed quartz oscillator according to the second embodiment of the present invention. An experimental sample was prepared by plating with a tin-based plating material (tin (Sn) and copper (Cu)) on a nickel silver material. In FIG. 3, zinc is detected in the range of 0 to 20 μm of the horizontal axis, which corresponded to the range of tin-based layer. This result shows that the zinc component in the nickel silver material is diffused by heat treatment. In addition, FIG. 3 shows a small range in which zinc is thickened at the interface between the nickel silver material and the tin-based layer, indicating that the copper-zinc alloy layer is formed at this range.

Figure 4:
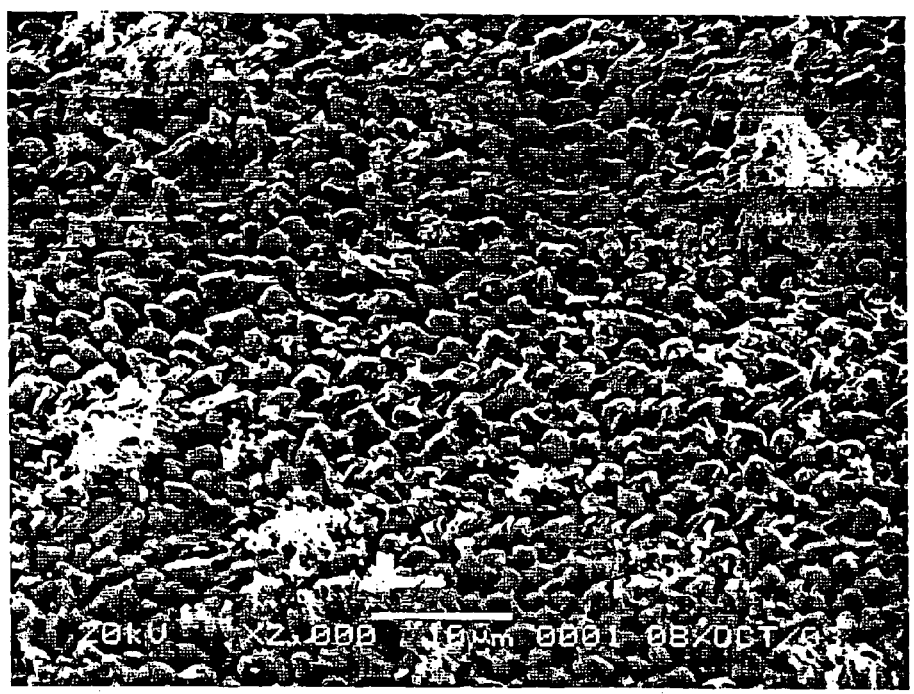
FIG. 4 is a micrograph showing a surface of a copper-zinc alloy layer in the method for producing a press-fit sealed quartz oscillator according to the second embodiment of the present invention.

FIG. 4 is a micrograph showing the surface of the copper-zinc alloy layer according to the above experimental result. FIG. 4 shows the copper-zinc alloy layer having a fine irregular-shaped, i.e., granular-shaped surface.

The present invention can be widely used in a press-fit sealed electronic component hermetically including a quartz oscillator, another functional component such as an electronic element or a magnetic element, or a functional material such as a battery, and used in a method for producing the same.

The entire disclosure of Japanese Patent Application No. 2003-384563 filed Nov. 14, 2003 is incorporated by reference in its entirety.

What is claimed is:

1. A press-fit sealed quartz oscillator comprising:
   a quartz oscillator;
   a plug to be equipped with the quartz oscillator; and
   a tube to be sealed by press-fitting the plug,
   wherein the plug is press-fitted into the tube such that a copper-zinc alloy layer formed on an outer surface of the plug is brought into close contact with a copper-zinc alloy layer formed on an inner surface of the tube.

2. The press-fit sealed guartz oscillator according to claim 1, wherein the tube and the plug comprise a nickel silver material and the copper-zinc alloy layer is disposed on the nickel silver material, the copper-zinc material being formed by heat treating a tin-copper layer plated on the nickel silver material.

3. The press-fit sealed guartz oscillator according to claim 2, wherein the tin-copper layer is lead-free.

4. A method for producing a press-fit sealed quartz oscillator comprising quartz oscillator, a plug to be equipped with the quartz oscillator, and a tube to be sealed by press-fitting the plug, the method comprising:
   a step of forming the plug and the tube with a nickel silver material;
   a step of forming a tin-copper layer on the nickel silver material by plating an exterior surface of the plug and an interior surface of the tube;
   a step of forming a copper-zinc alloy layer at an interface between the nickel silver material and the tin-copper layer by heat treating the tin-copper layer and the nickel silver material of the plug and the tube;
   a step of removing the tin-copper layer remaining on the copper-zinc alloy layer to expose the copper-zinc alloy layer; and
   a step of press fitting the plug into the tube such that the copper-zinc alloy layer formed on the outer surface of the plug is brought into close contact with the copper-zinc alloy layer on the inner surface of the tube to seal the tube.

5. The method for producing a press-fit sealed quartz oscillator according to claim 4, wherein the tin-copper layer is lead-free.

* * * * *